United States Patent
Sumii et al.

(10) Patent No.: US 9,368,464 B2
(45) Date of Patent: Jun. 14, 2016

(54) ELECTRONIC COMPONENT, MOTHER SUBSTRATE, AND ELECTRONIC COMPONENT MANUFACTURING METHOD

(71) Applicant: Murata Manufacturing Co., Ltd., Nagaokakyo-shi, Kyoto-fu (JP)

(72) Inventors: Hijiri Sumii, Nagaokakyo (JP); Manabu Nakahori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 94 days.

(21) Appl. No.: 14/248,380

(22) Filed: Apr. 9, 2014

(65) Prior Publication Data

US 2014/0217581 A1 Aug. 7, 2014

Related U.S. Application Data

(63) Continuation of application No. PCT/JP2012/074374, filed on Sep. 24, 2012.

(30) Foreign Application Priority Data

Oct. 31, 2011 (JP) .................................. 2011-238881

(51) Int. Cl.
*H01L 23/544* (2006.01)
*H01L 23/00* (2006.01)
(Continued)

(52) U.S. Cl.
CPC .............. *H01L 24/10* (2013.01); *H01L 23/315* (2013.01); *H01L 23/49838* (2013.01);
(Continued)

(58) Field of Classification Search
CPC ......... H01L 24/10; H01L 24/13; H01L 24/16; H01L 24/81; H01L 2224/54426; H01L 2224/16238; H01L 2224/81191; H01L 23/4952; H01L 23/544; H01L 2224/81; H01L 2224/73203; H01L 2924/15311; H01L 23/3128; H01L 2021/60231; H01L 2021/6024; H01L 2224/12105; H01L 2224/13025; H01L 2224/13028
USPC .......................... 257/778, 797, E23.179, 737
See application file for complete search history.

(56) References Cited

U.S. PATENT DOCUMENTS

2006/0091523 A1  5/2006  Shimanuki
2012/0056337 A1*  3/2012  Shiroki ............ G06K 19/07754
                                                        257/782

(Continued)

FOREIGN PATENT DOCUMENTS

JP   57-173952 A   10/1982
JP   05-077938 U   10/1993

(Continued)

OTHER PUBLICATIONS

Official Communication issued in International Patent Application No. PCT/JP2012/074374, mailed on Dec. 18, 2012.

*Primary Examiner* — Jasmine Clark
(74) *Attorney, Agent, or Firm* — Keating & Bennett, LLP

(57) ABSTRACT

An electronic component includes a plurality of electrodes provided in a rectangular or substantially rectangular box-shaped area on an upper surface of a substrate, an electronic component element mounted on the substrate by flip-chip bonding, and an identification mark. The identification mark is provided between a first electrode, which is arranged along one side of the rectangular or substantially rectangular box-shaped area, and a second electrode, which is adjacent to the first electrode along the one side, of the plurality of electrodes provided on the upper surface of the substrate, and is located on or outside a line connecting the outer side edges of the first and second electrodes.

18 Claims, 10 Drawing Sheets

(51) Int. Cl.
  *H01L 23/498*  (2006.01)
  *H01L 23/31*  (2006.01)
  *H05K 1/02*  (2006.01)
  *H05K 1/03*  (2006.01)
  *H05K 3/00*  (2006.01)
  *H05K 3/30*  (2006.01)

(52) U.S. Cl.
  CPC .............. *H01L 23/544* (2013.01); *H01L 24/81* (2013.01); *H01L 24/13* (2013.01); *H01L 24/16* (2013.01); *H01L 2223/54426* (2013.01); *H01L 2223/54486* (2013.01); *H01L 2224/131* (2013.01); *H01L 2224/13111* (2013.01); *H01L 2224/13144* (2013.01); *H01L 2224/16238* (2013.01); *H01L 2224/81191* (2013.01); *H01L 2224/81424* (2013.01); *H01L 2224/81439* (2013.01); *H01L 2924/181* (2013.01); *H05K 1/0269* (2013.01); *H05K 1/0306* (2013.01); *H05K 3/0097* (2013.01); *H05K 3/303* (2013.01); *H05K 2201/09918* (2013.01); *H05K 2201/10674* (2013.01)

(56) References Cited

U.S. PATENT DOCUMENTS

| | | | |
|---|---|---|---|
| 2013/0062757 A1* | 3/2013 | Feger | .................... H01L 23/544 257/737 |
| 2013/0108948 A1* | 5/2013 | Hu | ............................ G03F 1/38 430/5 |
| 2014/0312454 A1* | 10/2014 | Chen | .................... G03F 7/70625 257/499 |

FOREIGN PATENT DOCUMENTS

| | | |
|---|---|---|
| JP | 11-274357 A | 10/1999 |
| JP | 2001-044324 A | 2/2001 |
| JP | 2002-204057 A | 7/2002 |
| JP | 2006-128455 A | 5/2006 |

* cited by examiner

ELECTRONIC COMPONENT, MOTHER SUBSTRATE, AND ELECTRONIC COMPONENT MANUFACTURING METHOD

BACKGROUND OF THE INVENTION

1. Field of the Invention

The present invention relates to an electronic component including a substrate that has been singulated from a mother substrate. More specifically, the present invention relates to an electronic component including an electronic component element arranged on a substrate so that a functional circuit portion of the electronic component element is spaced apart from an upper surface of the substrate.

2. Description of the Related Art

In the related art, an electronic component manufacturing method is widely known and including placing a plurality of electronic component elements on a mother substrate, and then cutting the mother substrate. For example, the following manufacturing method is described in Japanese Unexamined Patent Application Publication No. 2001-44324 mentioned below.

According to the manufacturing method described in Japanese Unexamined Patent Application Publication No. 2001-44324, first, a mother substrate having a plurality of semiconductor chip placement areas provided on its upper surface is prepared. On the upper surface of this mother substrate, a number of electrodes are formed in individual semiconductor element chip placement areas. In addition, on the upper surface of the mother substrate, a cutting line checking pattern is formed on a cutting line along which the mother substrate is cut into individual electronic component units. This cutting line checking pattern is formed in a second area that is located outside a first area where a plurality of semiconductor element chips are placed. That is, the cutting line checking pattern is formed at a position where the cutting line along which the mother substrate is cut extends within the second area.

According to the manufacturing method mentioned above, after placing the plurality of semiconductor element chips, a sealing resin layer is formed so as to cover the first area. Thereafter, the mother substrate is cut along the cutting line passing through the cutting line checking pattern that is exposed in the second area.

As the miniaturization of electronic component chips advances, the dimension between the electrodes of electronic component chips becomes smaller, and so does the dimension between the corresponding electrodes on a mother substrate which are joined to the electrodes of the electronic component chips. Consequently, positioning of electronic component element chips becomes difficult. In particular, when joining to electrodes on the substrate by using bumps, there is a possibility that misalignment of the joints between the bumps and the electrodes may lead to a decrease in joint strength.

According to the manufacturing method described in Japanese Unexamined Patent Application Publication No. 2001-44324, there is a possibility of erroneous mounting occurring during placement of semiconductor element chips executed prior to cutting. Although the cutting line checking pattern mentioned above is used for the positioning that is executed when finally cutting a composite substrate, it is also possible to mount semiconductor element chips by using the cutting line checking pattern as a reference. However, as electronic component chips such as semiconductor element chips are miniaturized as mentioned above, it is difficult to position and mount electronic component chips with high accuracy solely by using the cutting line checking pattern provided in the second area as a reference.

FIGS. 15 and 16 are schematic plan views each illustrating an example of such erroneous mounting. In FIG. 15, areas on a mother substrate 1001 which are enclosed by cutting lines indicated by broken lines A1 and A2 represent individual electronic-component-element placement areas. As indicated by a solid line in FIG. 15, there is a possibility that an electronic component element chip 1002 may be erroneously mounted so as to straddle adjacent electronic-component-element-chip placement areas.

In some cases, individual electronic component element chips are placed after dividing the mother substrate into individual substrates. In such cases as well, as illustrated in FIG. 16, when a plurality of substrates 1001A are arranged in a grid form owing to the division of the mother substrate, there is also a possibility that the electronic component element chip 1002 may be mounted so as to straddle adjacent substrates 1001A.

SUMMARY OF THE INVENTION

Preferred embodiments of the present invention provide an electronic component including a structure that allows an electronic component element to be reliably placed on a substrate by flip-chip bonding, a mother substrate that makes it possible to provide the electronic component, and a manufacturing method for the electronic component.

An electronic component according to a preferred embodiment of the present invention includes a substrate that includes a plurality of electrodes provided in a rectangular or substantially rectangular box-shaped area on an upper surface of the substrate, and an electronic component element that is mounted on the upper surface of the substrate, the electronic component element including a functional circuit portion on a lower surface of the electronic component element and a plurality of bumps provided in an area surrounding the functional circuit portion. The plurality of bumps are joined to the electrodes on the upper surface of the substrate by flip-chip bonding so that the functional circuit portion of the electronic component element is separated by a gap from the upper surface of the substrate. Further, the electronic component includes an identification mark. The identification mark is provided between a first electrode, which is arranged along one side of the rectangular or substantially rectangular box-shaped area, and a second electrode, which is adjacent to the first electrode along the one side, of the plurality of electrodes provided on the upper surface of the substrate, and is located on or outside a line connecting outer side edges of the first and second electrodes.

In a specific aspect of the electronic component according to a preferred embodiment of the present invention, the identification mark preferably is I-shaped or substantially I-shaped, and extends parallel or substantially parallel to a straight line connecting the outer side edges of the first and second electrodes.

In the electronic component according to a preferred embodiment of the present invention, the identification mark may be provided along a peripheral edge of the substrate. In this case, when cutting each individual substrate out of the mother substrate, the substrate is cut out with high accuracy by using the peripheral edge of the identification mark.

In the electronic component according to a preferred embodiment of the present invention, the identification mark may be arranged in an area between a straight line connecting the outer side edges of the first and second electrodes, and a boundary line extending along a peripheral edge of the substrate and separated by a predetermined distance from the peripheral edge. This configuration is preferable for the following reason. That is, because the identification mark is not exposed at the end surface of the substrate of the electronic component, damage to the identification mark caused by direct contact between a transport jib, a packaging member, a cutting edge, or the like and the identification mark is significantly reduced or prevented.

In the electronic component according to a preferred embodiment of the present invention, preferably, the identification mark is arranged so that in plan view, the electronic component element does not overlap the identification mark. In this case, the identification mark can be viewed from above also after placement of the electronic component element. Therefore, the mother substrate is cut with high accuracy with reference to the identification mark after placing electronic component elements on the mother substrate.

In still another specific aspect of the electronic component according to a preferred embodiment of the present invention, in a rectangular or substantially rectangular box-shaped area including first to fourth sides, a difference between a plurality of adjacent inter-electrode pitches along the first side and a difference between a plurality of adjacent inter-electrode pitches along the second side differ from each other, and the identification mark is provided outside a side of the rectangular or substantially rectangular box-shaped area along which a difference between inter-electrode pitches is larger. In this case, it is possible to effectively reduce the risk of erroneous recognition of the electronic-component-element mounting area.

In yet another specific aspect of the electronic component according to a preferred embodiment of the present invention, the identification mark is arranged outside the side along which a difference between inter-electrode pitches is larger, and outside an area between electrodes that are separated by a relatively large inter-electrode pitch.

In yet still another specific aspect of the electronic component according to a preferred embodiment of the present invention, as the electronic component element, a first electronic component element and a second electronic component element are placed on the substrate, and the rectangular or substantially rectangular box-shaped area surrounds an area in which each of the first electronic component element and the second electronic component element is placed.

In yet still another specific aspect of the electronic component according to a preferred embodiment of the present invention, the plurality of electrodes preferably include four electrodes provided at four corner portions of the rectangular or substantially rectangular box-shaped area, at least one of the four electrodes having a rectangular or substantially rectangular shape, and an L-shaped or substantially L-shaped identification electrode portion is arranged so as to connect with two sides of the electrode having a rectangular or substantially rectangular shape which are located at an outer side of the substrate, the L-shaped or substantially L-shaped identification electrode portion being located on or outside a line connecting outer side edges of the plurality of electrodes provided at the corner portions. In this case, the risk of erroneous mounting of the electronic component is further reduced or prevented.

In another preferred embodiment of the present invention, an electronic component includes a substrate that includes a plurality of electrodes provided in a rectangular or substantially rectangular box-shaped area on an upper surface of the substrate, and an electronic component element that is mounted on the upper surface of the substrate, the electronic component element including a functional circuit portion on a lower surface of the electronic component element and a plurality of bumps provided in an area surrounding the functional circuit portion. The plurality of bumps are joined to the electrodes on the upper surface of the substrate by flip-chip bonding so that the functional circuit portion of the electronic component element is separated by a gap from the upper surface of the substrate. The plurality of electrodes preferably include four electrodes provided at four corner portions of the rectangular or substantially rectangular box-shaped area, at least one of the four electrodes having a rectangular or substantially rectangular shape. An L-shaped or substantially L-shaped identification electrode portion is arranged so as to connect with two sides of the electrode having a rectangular or substantially rectangular shape which are located at an outer side of the substrate, the L-shaped or substantially L-shaped identification electrode portion being located on or outside a line connecting outer side edges of the plurality of electrodes provided at the corner portions.

A mother substrate according to a preferred embodiment of the present invention is a mother substrate which is used for manufacture of the electronic component according to other preferred embodiments of the present invention, in which the plurality of electrodes and the identification mark or the L-shaped or substantially L-shaped identification electrode portion is provided on an upper surface of each of substrate portions of the mother substrate which are to be singulated into individual electronic component units.

An electronic component manufacturing method according to a further preferred embodiment of the present invention is a method for manufacturing the electronic component according to other preferred embodiments of the present invention, and includes the steps of preparing a mother substrate, the mother substrate being an aggregate of substrate portions on which individual electronic components are formed, the mother substrate including, on its upper surface, the plurality of electrodes corresponding to each of the substrate portions, positioning and mounting a plurality of electronic component elements by using the identification mark or the L-shaped or substantially L-shaped identification electrode portion, on the substrate portions corresponding to the individual electronic components, and cutting the mother substrate into a plurality of substrates formed by a plurality of substrate portions, before or after mounting the plurality of electronic component elements.

According to various preferred embodiments of the present invention, a plurality of electrodes including first and second electrodes to which electronic component elements are joined are provided in a rectangular or substantially rectangular box-shaped area on the upper surface of a substrate which surrounds an area corresponding to a functional circuit portion, an identification mark is located on or outside a line connecting the outer side edges of the first and second electrodes, and the identification mark is provided within a substrate of each individual electronic component unit. Consequently, an electronic component is easily and reliably mounted on the upper surface of the mother substrate, or on the upper surface of each of individual substrates into which the mother substrate is singulated in advance. Therefore, erroneous mounting of an electronic component is reliably reduced or prevented.

Moreover, according to another broad aspect of various preferred embodiments of the present invention, electrodes are provided at the four corner portions of the rectangular or substantially rectangular box-shaped area, and an L-shaped or substantially L-shaped identification portion is connected with the outside of each of the electrodes. Consequently, because an identification mark is provided within a substrate of each individual electronic component unit, an electronic component is reliably mounted on the upper surface of the mother substrate, or on the upper surface of each of individual substrates into which the mother substrate is singulated in advance. Therefore, erroneous mounting of an electronic component is reliably reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be explained by describing specific preferred embodiments of the present invention with reference to the drawings.

Figure 1A:
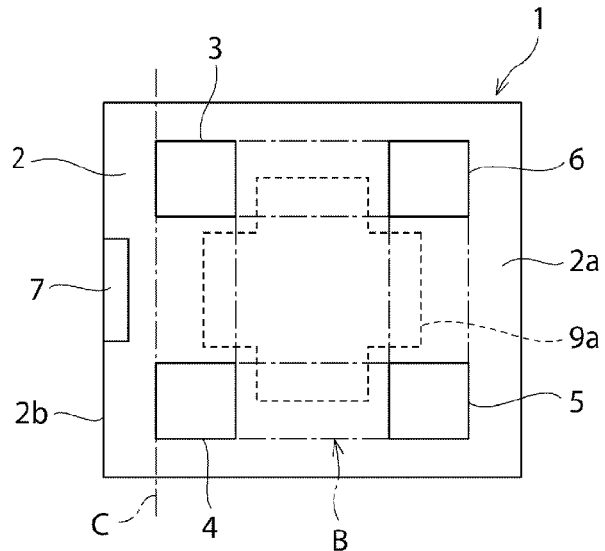
FIG. 1A is a plan view of a substrate included in an electronic component according to a first preferred embodiment of the present invention.
Figure 1B:
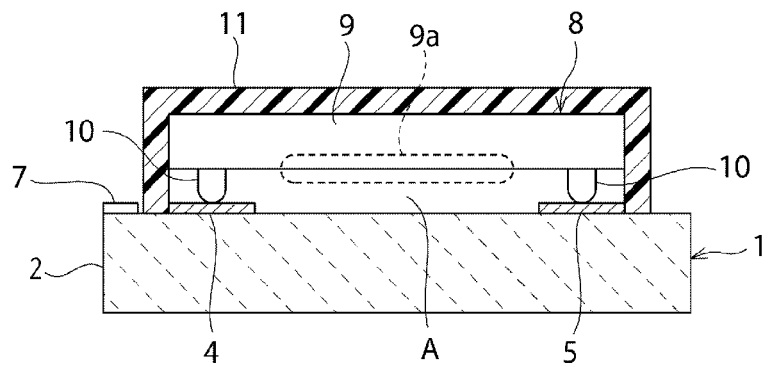
FIG. 1B is a schematic elevational cross-sectional view of the electronic component obtained in accordance with the first preferred embodiment.

FIG. 1A is a plan view of a substrate included an electronic component according to a first preferred embodiment of the present invention, and FIG. 1B is a schematic elevational cross-sectional view of the electronic component according to this preferred embodiment.

As illustrated in FIG. 1B, an electronic component 1 includes a substrate 2. The substrate 2 is preferably made of a suitable insulating material such as aluminum. In this preferred embodiment, the substrate 2 preferably has a rectangular or substantially rectangular flat shape.

As illustrated in FIG. 1A, a plurality of electrodes 3 to 6 are provided on an upper surface 2a of the substrate 2. In addition, an identification mark 7 is separate from the plurality of electrodes 3 to 6.

The plurality of electrodes 3 to 6 are preferably made of a suitable metal such as Al or Ag. Forming the plurality of electrodes 3 to 6 and the identification mark 7 by using the same material and the same processes are preferred because the number of manufacturing processes is reduced, and also because the difference in reflectance of light between the electrodes and the identification mark becomes small to allow stable measurement of score values that will be described later. It is to be noted, however, that the method of forming each of the plurality of electrodes 3 to 6 and the identification mark 7 is not particularly limited. Application/baking of a conductive paste or a thin-film forming method such as sputtering, for example, may be used.

In plan view of the substrate 2, each of the plurality of electrodes 3 to 6 preferably has a square or substantially square shape in this preferred embodiment. However, the shape of the plurality of electrodes 3 to 6 is not particularly limited, and may be a shape other than a square or substantially square. For example, the shape may be a rectangle other than a square, that is, an oblong.

As illustrated in FIG. 1B, an electronic component element 8 is mounted on the substrate 2 by a flip-chip bonding method. The electronic component element 8 includes an electronic component body 9. The electronic component body 9 includes a functional circuit portion 9a. The functional circuit portion 9a is provided at the center or approximate center of the lower surface of the electronic component body opposite to the upper surface 2a of the substrate 2. In FIG. 1A, the portion where the functional circuit portion 9a is provided is indicated by a broken line. In this preferred embodiment, the electronic component body 9 is a surface acoustic wave element including a piezoelectric substrate, and at least one interdigital transducer (IDT) electrode located on the lower surface of the piezoelectric substrate. Therefore, the functional circuit portion 9a is a portion including the IDT electrode where a surface acoustic wave is excited. The functional circuit portion 9a is separated by a space A from the upper surface 2a of the substrate 2. Accordingly, vibration in the functional circuit portion 9a is unlikely to be hindered.

Bumps 10 are arranged around the functional circuit portion 9a. The lower ends of the bumps 10 are joined to the electrodes 4 and 5. Although not illustrated in FIG. 1B, the bumps 10 are also joined to the electrodes 3 and 6 illustrated in FIG. 1A. At least some or all of the bumps 10 are electrically connected to the functional circuit portion 9a.

As the bumps 10, suitable metal bumps such as Au bumps or solder bumps may be used.

A sealing resin layer 11 is provided so as to cover the electronic component element 8. The sealing resin layer 11 is arranged so as to define the space A.

One of the unique features of the electronic component 1 according to this preferred embodiment resides in that the identification mark 7 is provided at a specific position.

That is, on the upper surface 2a of the substrate 2, the plurality of electrodes 3 to 6 are arranged within a rectangular or substantially rectangular box-shaped area B indicated by an alternate long and short dash line. More specifically, the plurality of electrodes 3 to 6 are arranged at the respective corner portions of the rectangular or substantially rectangular box-shaped area B. The plurality of bumps 10 are respectively joined to the plurality of electrodes 3 to 6. Therefore, an area 9a obtained by downwardly projecting the functional circuit portion 9a is located inside the area B.

In this preferred embodiment, the identification mark 7 preferably is arranged outside the rectangular or substantially rectangular box-shaped area B. That is, the identification mark 7 is arranged between the electrodes 3 and 4, which are arranged along one side of the rectangular or substantially rectangular box-shaped area B, of the plurality of electrodes 3 to 6, and outside a line C connecting the outer side edges of the electrodes 3 and 4. In this preferred embodiment, the electrodes 3 and 4 correspond to first and second electrodes, respectively.

The identification mark 7 preferably is provided in an area outside the line C connecting the outer side edges of the electrodes 3 and 4, and so as to extend along a peripheral edge 2b of the substrate 2. In addition, the identification mark 7 preferably is I-shaped or substantially I-shaped, that is, an oblong shape, and extends parallel or substantially parallel to the line C.

Figure 1C:
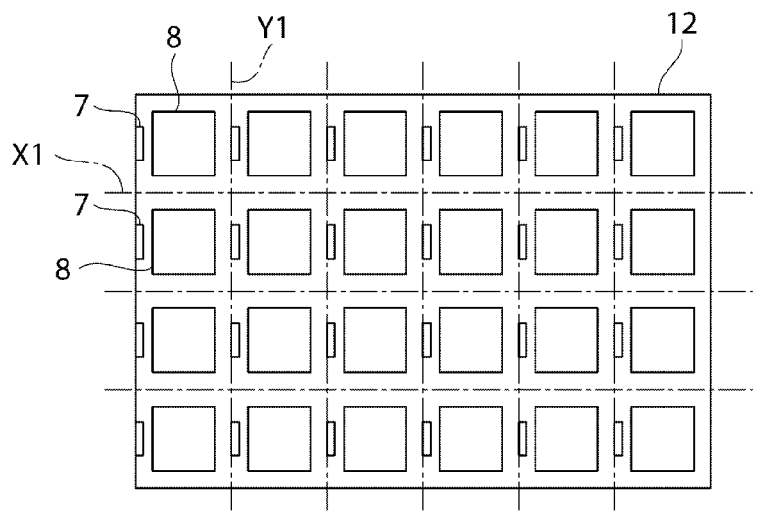
FIG. 1C is a plan view of a mother substrate.

When manufacturing the electronic component 1, normally, a mother substrate 12 is prepared as illustrated in FIG. 1C. A plurality of the electronic component elements 8 are placed on the mother substrate 12. Next, a sealing resin layer (not illustrated) is formed. Thereafter, the mother substrate 12 is cut into individual substrates 2 in order to obtain individual electronic components. In this case, the identification mark 7 preferably is always provided within each individual substrate 2.

As previously mentioned, miniaturization of electronic component elements, and reductions in inter-electrode pitch on a substrate lead to the possibility of erroneous mounting of electronic component elements.

In this regard, according to this preferred embodiment, even in a case where, for example, the pitch between the electrodes 3 and 4 becomes narrower, or miniaturization of the electronic component element 8 is advanced, for each single electronic component unit, the electronic component element 8 is placed on a predetermined portion of the substrate 2 with high accuracy and reliability, by using the identification mark 7 as a reference. That is, for each individual electronic component 1, the identification mark 7 is provided within the substrate 2. Therefore, while each individual substrate 2 is still in the form of the mother substrate 12, the electronic component element 8 is placed within a narrow area including an area on which to place each individual electronic component 1, by using the identification mark 7 as a reference. Therefore, erroneous placement of the electronic component element 8 reliably reduced or prevented.

Moreover, the functional circuit portion 9a of the electronic component element 8 faces the portion inside the rectangular or substantially rectangular box-shaped area including the electrodes 3 to 6. Therefore, even when the substrate 2 suffers warping, or even when warping occurs while the substrate 2 is still in the form of the mother substrate 12, contact between the functional circuit portion 9a and the substrate 2 or the mother substrate 12 is prevented with reliability. Therefore, damage to the functional circuit portion 9a is prevented. Further, because the identification mark 7 is provided between a plurality of electrodes on the substrate 2, the warping strength of the substrate 2 between the plurality of electrodes increases so as to reduce the amount of warping of the substrate 2.

In some cases, the electronic component element 8 preferably is placed on each individual substrate 2 after dividing the mother substrate 12 into individual substrates 2 in advance. In that case as well, in a state in which the mother substrate 12 is cut and a plurality of substrates 2 are arranged in a grid form, the electronic component element 8 is reliably placed on each individual substrate 2 by using the identification mark 7 provided in each individual substrate 2 as a reference. Therefore, also in this case, erroneous placement of the electronic component element 8 is reliably prevented.

Moreover, in this preferred embodiment, the identification mark 7 preferably is I-shaped or substantially I-shaped and is provided along the peripheral edge 2b of the substrate 2. Therefore, the identification mark 7 is recognized easily.

Figure 2:
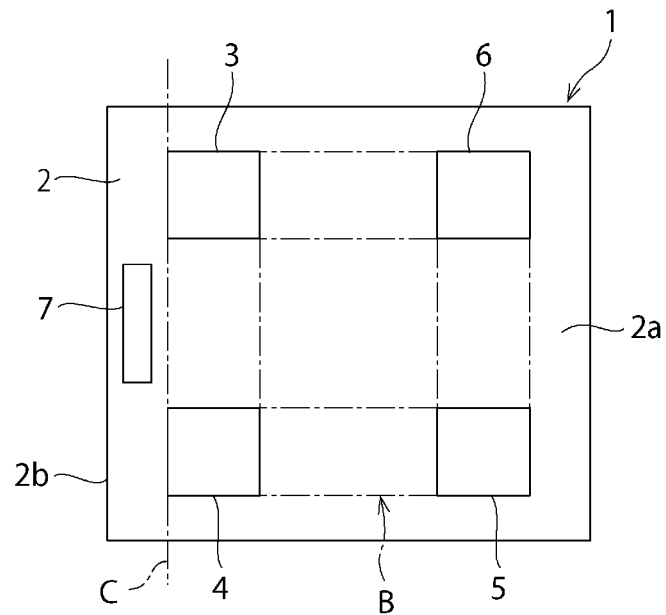
FIG. 2 is a plan view of a substrate included in a modification of the first preferred embodiment of the present invention.

FIG. 2 is a plan view of a substrate used for an electronic component according to a modification of the first preferred embodiment of the present invention. According to the modification, on the upper surface 2a of the substrate 2, the identification mark 7 preferably is provided in the area between the line C mentioned above and the peripheral edge 2b of the substrate 2. In this way, the identification mark 7 is spaced apart from the peripheral edge 2b of the substrate 2. Like the first preferred embodiment, this modification also makes it possible to recognize each individual substrate 2 using the identification mark 7, and reliably join the plurality of bumps 10 to the electrodes 3 to 6 to place the electronic component element 8 on the substrate 2.

In addition, the identification mark 7 preferably is spaced apart from the peripheral edge 2b. Therefore, for example, there is no risk of a cutter and the identification mark 7 coming into contact with each other when cutting the mother substrate, causing deformation or partial detachment of the identification mark 7.

In addition, in a case where the sealing resin layer 11 is formed outside the identification mark 7 when forming the sealing resin layer 11 illustrated in FIG. 1B mentioned above, it is also possible to significantly reduce or prevent flowing of the sealing resin layer 11 to the inside of the identification mark 7, that is, flowing of the sealing resin layer 11 into the space A mentioned above.

Figure 3:
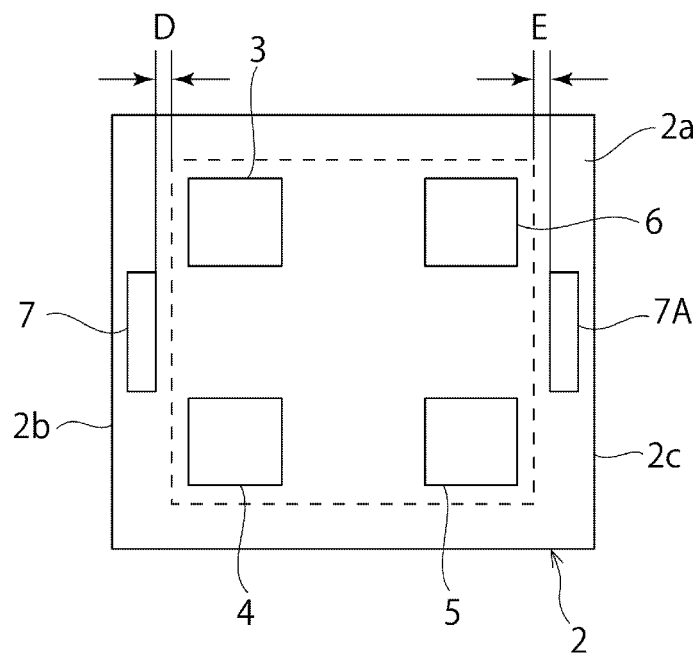
FIG. 3 is a plan view of a substrate of an electronic component according to another modification of the first preferred embodiment of the present invention.

FIG. 3 is a schematic plan view illustrating another modification of the electronic component according to the first preferred embodiment of the present invention.

As illustrated in FIG. 3, according to this modification, a plurality of identification marks 7 and 7A preferably are arranged on the upper surface 2a of the substrate 2. More specifically, as in the modification illustrated in FIG. 2, the identification mark 7 is provided in the area between the line C and the peripheral edge 2b, and likewise, the identification mark 7A is provided also on the side of a peripheral edge 2c opposite to the peripheral edge 2b.

In this modification as well, the position at which to place the electronic component element on each individual substrate 2 is determined by using the identification marks 7 and 7A. Therefore, erroneous placement of the electronic component element is prevented with greater reliability.

In addition, in this modification, the provision of the plurality of identification marks 7 and 7A makes it possible to determine the placement position of the electronic component element with greater accuracy.

Further, suppose that, for example, the electronic component element 8 is placed so that the outer edge of the electronic component element 8 is located in the portion indicated by a broken line in FIG. 3. Displacement of the electronic component element placement position can be checked on the basis of the separation D between the electronic component element 8 and the identification mark 7 and the separation E between the electronic component element 8 and the identification mark 7A. Therefore, the accuracy of the placement position of the electronic component element 8 is further improved. In particular, misalignment of the placement position of the electronic component element 8 is easily determined by visual inspection or an image taken with a normal camera, even without using an X-ray image or the like. Therefore, the joining between the plurality of bumps 10 and the electrodes 3 to 6 illustrated in FIG. 1 mentioned above is accomplished with high accuracy.

Figure 4:
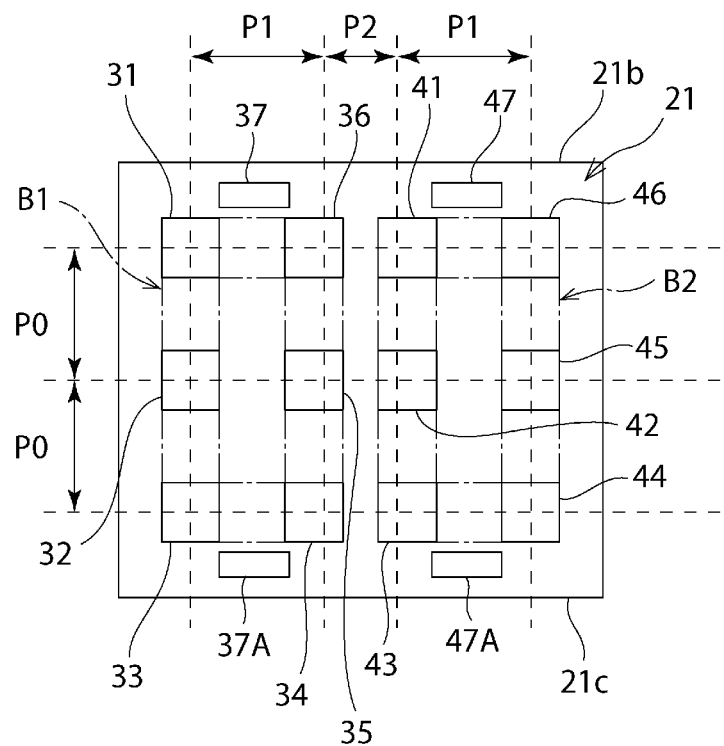
FIG. 4 is a plan view of a substrate of an electronic component according to a second preferred embodiment of the present invention.

FIG. 4 is a plan view of a substrate included in an electronic component according to a second preferred embodiment of the present invention. According to this preferred embodiment, two electronic component elements are placed on a substrate 21. Accordingly, a plurality of electrodes 31 to 36 and a plurality of electrodes 41 to 46 preferably are provided within two rectangular or substantially rectangular box-shaped areas B1 and B2 indicated by alternate long and short dash lines, respectively.

Identification marks 37 and 37A and identification marks 47 and 47A preferably are provided outside the rectangular or substantially rectangular box-shaped areas B1 and B2, respectively.

More specifically, by way of example of the plurality of electrodes 31 to 36, the electrodes 31, 33, 34, and 36 are located at the corner portions of the rectangular or substantially rectangular box-shaped area B1. Further, the electrodes 32 and 35 are located in the middle of the long side of the rectangular or substantially rectangular box-shaped area B1. The pitch P0 between the electrodes 31 and 32, and the pitch P0 between the electrodes 32 and 33 preferably are equal or substantially equal.

To the contrary, the pitch P1 between the electrodes 31 and 36, and the pitch P2 between the electrodes 36 and 41 differ greatly from each other. That is, along a peripheral edge 21b of the substrate 21, the pitches between adjacent electrodes are different, and the difference in inter-electrode pitch is large. Of the peripheral edges of the substrate 21, the identification marks 37 and 47 are provided along the peripheral edge 21b where the difference between adjacent inter-electrode pitches is large.

Likewise, the identification marks 37A and 47A are also provided along a peripheral edge 21c where the difference between adjacent inter-electrode pitches is large.

Like the identification mark 7 according to the first preferred embodiment, the identification marks 37, 37A, 47, and 47A preferably are I-shaped or substantially I-shaped, that is, an oblong shape. The identification marks 37, 37A, 47, and 47A extend in a direction parallel or substantially parallel to the peripheral edges 21b and 21c. That is, supposing that the electrodes 31 and 36 are the first and second electrodes, respectively, the identification mark 37 is located outside a line connecting the peripheral edges of the electrodes 31 and 36, so as to extend parallel or substantially parallel to the line.

This preferred embodiment preferably is of substantially the same structure as that in FIG. 3 mentioned above, except that the plurality of electrodes 31 to 36 and the plurality of electrodes 41 to 46 are provided so that two electronic component elements are located on the substrate 21.

Therefore, in this preferred embodiment as well, the provision of the identification marks 37, 37A, 47, and 47A on each individual substrate 21 allows two electronic component elements to be placed with high accuracy. That is, erroneous mounting of electronic component elements is reliably prevented.

In this preferred embodiment, the plurality of electrodes 31 to 36 and 41 to 46 are provided as mentioned above. At this time, the identification marks 37, 37A, 47, and 47A are arranged so that, of the peripheral edges of the substrate 21, their longitudinal direction is parallel or substantially parallel to the peripheral edge where the difference in inter-electrode pitch mentioned above is large. Electronic component elements need to be placed with higher accuracy in the direction along the peripheral edge where the difference in inter-electrode pitch is large. In this preferred embodiment, the provision of the identification marks 37, 37A, 47, and 47A as mentioned above makes it possible to determine the positions of electronic component elements and mount the electronic component elements with high accuracy, also along the side on which the difference in inter-electrode pitch is large.

Figure 5A:
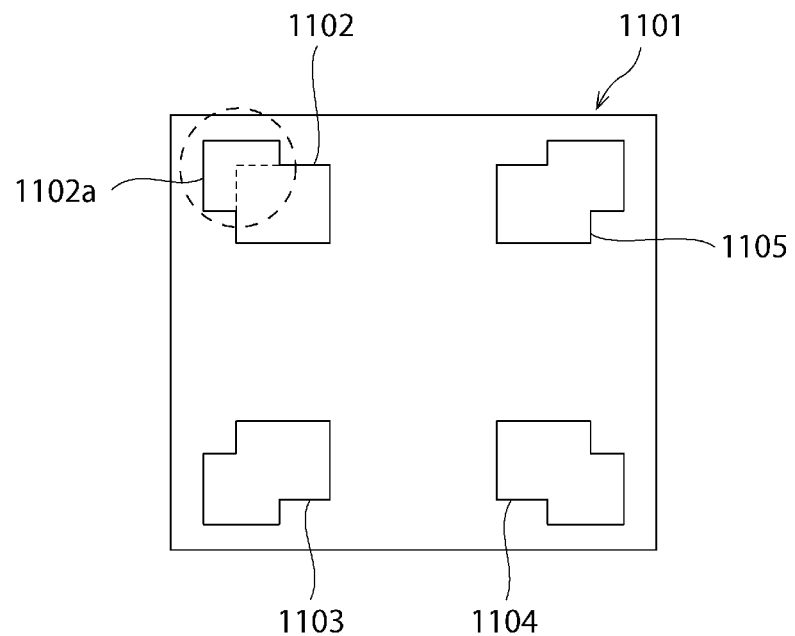
FIG. 5A is a plan view of a substrate for explaining a modification of an identification mark arranged at each of the corner portions of a rectangular or substantially rectangular box shape.
Figure 5B:
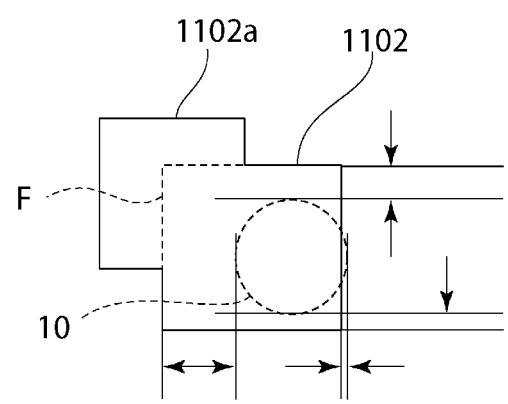
FIG. 5B is an enlarged plan view for explaining the shape of the identification mark provided at each of the corner portions.

FIGS. 5A and 5B are respectively a schematic plan view of a substrate for explaining another example of the shape of an identification mark, and an enlarged plan view of an electrode structure for explaining the shape of the identification mark. On the upper surface of a substrate 1101 illustrated in FIG. 5A, there are provided a plurality of electrodes 1102 to 1105 to which bumps are joined, and an identification mark as an L-shaped or substantially L-shaped identification electrode portion is arranged on the outside including a line connecting the outer side edges of the plurality of electrodes. However, no identification mark is arranged between the first and second electrodes described above.

It is to be noted that by way of example of the electrode 1102, the electrode 1102 has such a shape that an L-shaped or substantially L-shaped identification electrode portion 1102a is integrally connected with a square electrode. As indicated by a broken line F in FIG. 5B, the identification electrode portion 1102a preferably is L-shaped or substantially L-shaped.

In other words, the identification mark has such a shape that square-shaped electrode films are displaced in their diagonal direction, and overlapped with each other. Providing the identification electrode portion 1102a as mentioned above makes it possible to increase recognition accuracy for the electrode 1102 at the corner portion. A third preferred embodiment provided with the identification electrode portion 1102a will be explained with reference to experimental examples described later.

Figure 6:
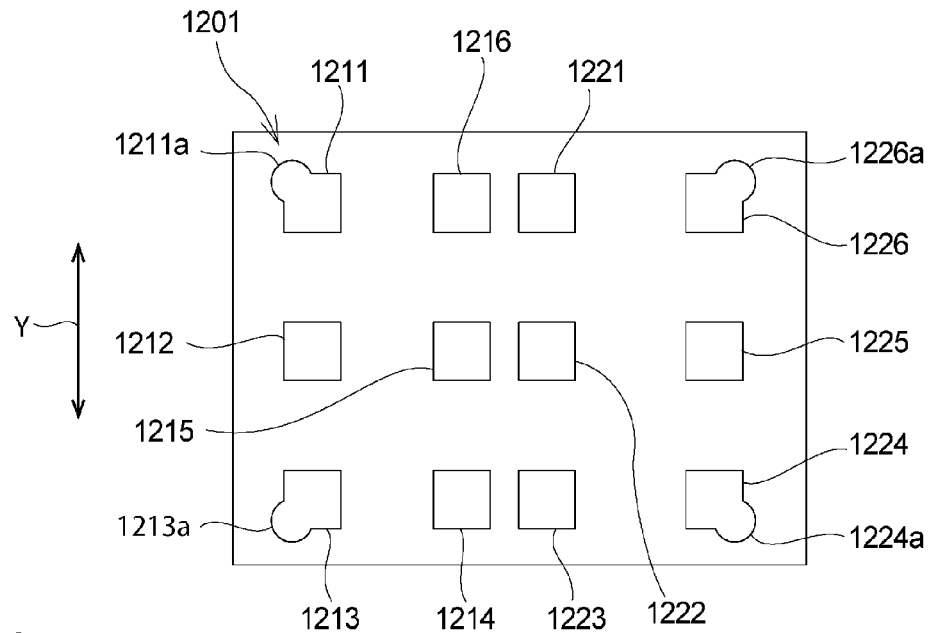
FIG. 6 is a plan view of a substrate of an electronic component according to Comparative Example 1.

FIG. 6 is a schematic plan view of a substrate according to Comparative Example 1. As in the second preferred embodiment described above, two electronic component elements are placed on a substrate 1201 according to Comparative Example 1. Accordingly, a plurality of electrodes 1211 to 1216 are provided within one rectangular or substantially rectangular box-shaped area. Likewise, a plurality of electrodes 1221 to 1226 are provided within another rectangular or substantially rectangular box-shaped area. In this example, the electrodes 1211, 1213, 1224, and 1226 located at the corner portions of the substrate 1201 are provided with semicircular projections 1211a, 1213a, 1224a, and 1226a, respectively, which project toward the corresponding corner portions of the substrate. As compared with the above-mentioned structure including the L-shaped or substantially L-shaped identification electrode portion 1102a, according to a structure including such semicircular projection 1211a and the like, recognition accuracy for the electrode positions at the corner portions is low.

Next, an experiment was conducted in which the electronic component mounting position is recognized by using each of substrates illustrated in FIGS. 6 to 12. Substrates illustrated in FIGS. 7 to 12 are configured as described below. The substrate 1201 in FIG. 6 is configured as mentioned above.

Figure 7:
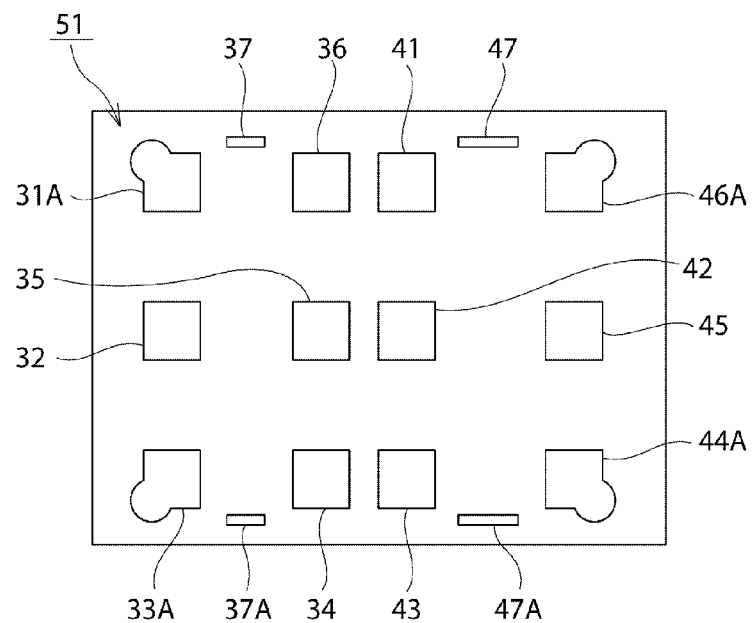
FIG. 7 is a plan view of a substrate of an electronic component according to Example 1.

A substrate 51 according to Example 1 illustrated in FIG. 7 is the same as that of the second preferred embodiment illustrated in FIG. 4, except that each of electrodes 31A, 33A, 44A, and 46A at the corner portions is provided with a semi-circular projection as in Comparative Example 1. That is, because the substrate 51 has the identification marks 37, 37A, 47, and 47A according to a preferred embodiment of the present invention, the substrate 51 corresponds to an example according to a preferred embodiment of the present invention.

Figure 8:
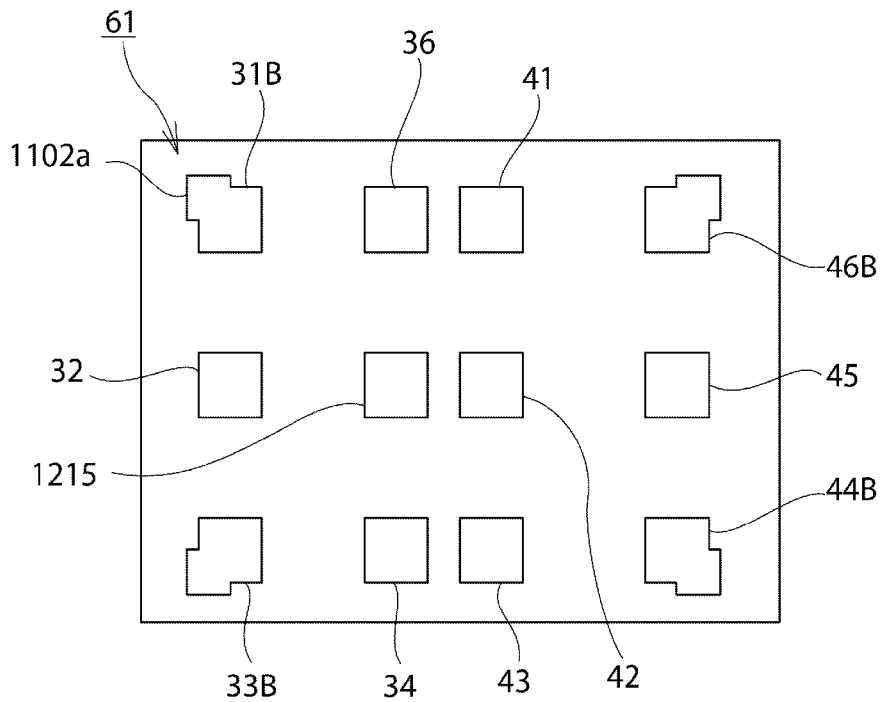
FIG. 8 is a plan view of a substrate of an electronic component according to Example 2.

A substrate 61 according to Example 2 illustrated in FIG. 8 is the same as the substrate 1201, except that each of electrodes 31B, 33B, 44B, and 46B at the corner portions has the L-shaped or substantially L-shaped identification electrode portion 1102a illustrated in FIG. 5.

Figure 9:
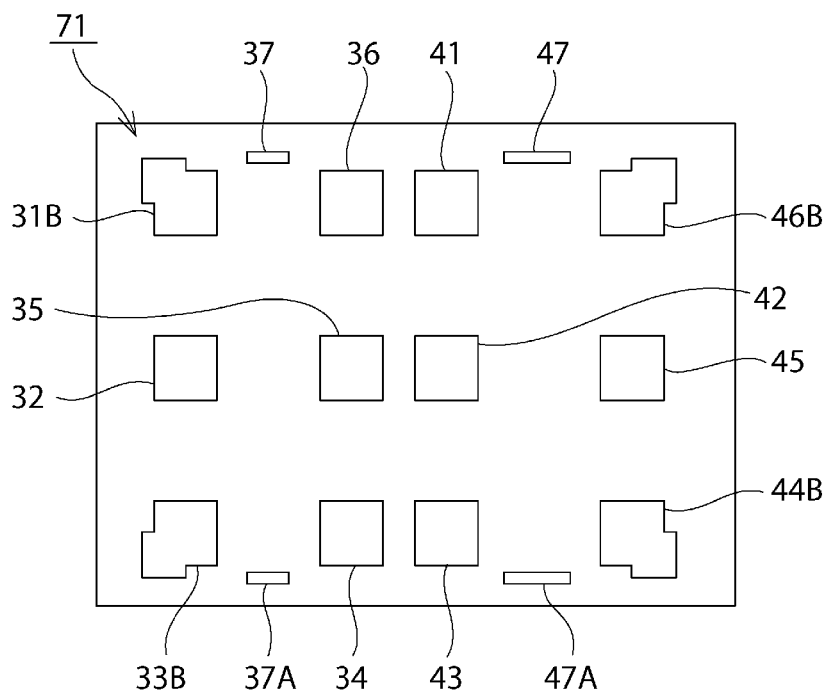
FIG. 9 is a plan view of a substrate of an electronic component according to Example 3.

A substrate 71 according to Example 3 illustrated in FIG. 9 is the same as that of the second preferred embodiment, except that an L-shaped or substantially L-shaped identification electrode portion as illustrated in FIGS. 5A and 5B is connected with each of the electrodes 31B, 33B, 44B, and 46B located at the corner portions. Therefore, the substrate 71 according to Example 3 illustrated in FIG. 9 differs from Example 1 illustrated in FIG. 7 in the shape of the electrodes at the corner portions.

Figure 10:
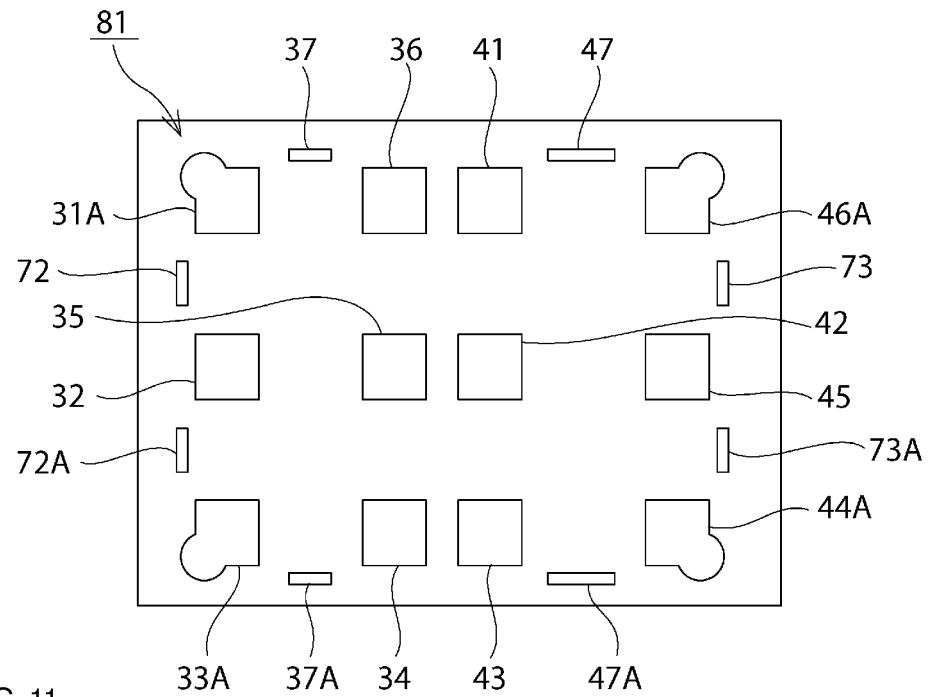
FIG. 10 is a plan view of a substrate of an electronic component according to Example 4.

In addition to the configuration of the substrate 61 illustrated in FIG. 7, a substrate 81 according to Example 4 illustrated in FIG. 10 is further provided with identification marks 72, 72A, 73, and 73A. In other words, the identification marks are provided also along the side where inter-electrode pitches are equal or substantially equal. Otherwise, the substrate 81 is the same as the substrate illustrated in FIG. 7.

Figure 11:
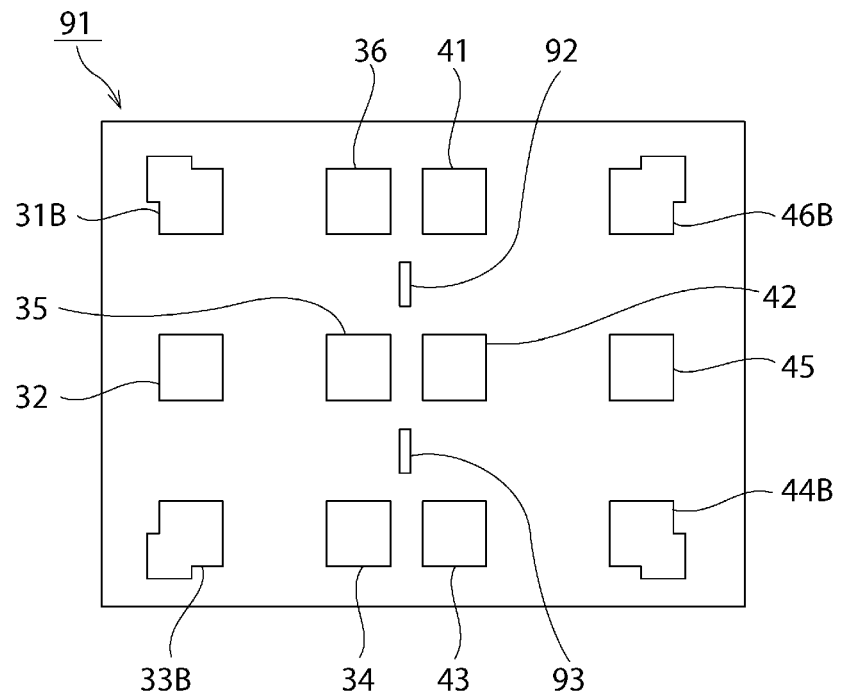
FIG. 11 is a plan view of a substrate of an electronic component according to Example 5.

A substrate 91 according to Example 5 illustrated in FIG. 11 includes identification marks 92 and 93. The identification marks 92 and 93 are provided between electronic component areas arranged side by side where two electronic component elements are placed side by side on the upper surface of the substrate. That is, the identification marks 92 and 93 are provided at the center of the substrate 91, so that the identification marks 92 and 93 are located outside the peripheral edges of the respective rectangular or substantially rectangular box-shaped areas of a plurality of electrodes surrounding the respective functional circuit portions of the two electrode component elements, but between the peripheral edges of the two adjacent rectangular or substantially rectangular box-shaped areas. Otherwise, the shape of the substrate 91 is the same as the substrate illustrated in FIG. 8. The substrate 91 illustrated in FIG. 11 corresponds to an example according to a preferred embodiment of the present invention because the substrate 91 includes the identification marks 92 and 93.

Figure 12:
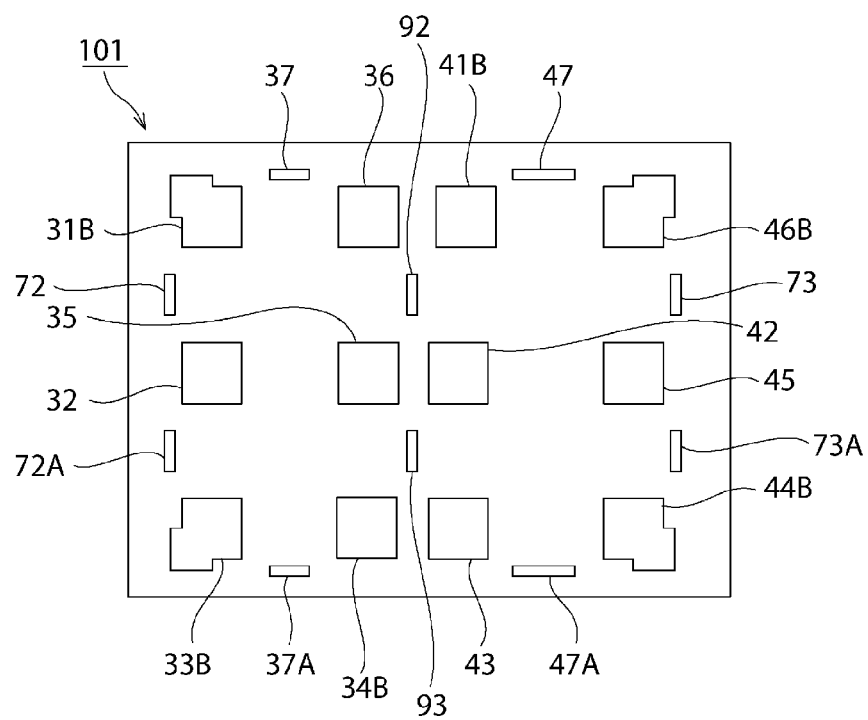
FIG. 12 is a plan view of a substrate of an electronic component according to Example 6.

FIG. 12 is a plan view of a substrate 101 corresponding to Example 6. In the substrate 101, as opposed to the substrate illustrated in FIG. 10, the identification marks 92 and 93 illustrated in FIG. 11 are added, and further, each of the electrodes 31B, 33B, 44B, and 46B at the corner portions includes an L-shaped or substantially L-shaped identification electrode portion integrally connected with a rectangular electrode.

By using mother substrates each obtained as an aggregate of the individual substrates according to Comparative Example 1 and Examples 1 to 6 mentioned above, the recognition accuracy for the placement positions of two electronic component elements on each substrate portion was evaluated. More specifically, first, substrates with a plurality of samples provided thereon are prepared for the respective examples and the comparative example. Next, image information obtained by taking an image of the upper surface portion of a singulated substrate, which serves as a reference for comparison, is stored into a memory device. Further, as the position at which to take the image of each identification mark, for every sample, by using an image taken of the upper surface portion of the corresponding singulated substrate with no shift in pitch in the Y-direction illustrated in FIG. 6, and an image taken with a shift of one pitch from the original position, score values obtained by converting the degrees of match between images into numbers in 100 steps on a scale of 0 to 99 are determined by an image processing device. It is supposed that a score value of 0 indicates low degree of match, and a score value of 99 indicates high degree of match. The difference between the two score values is further determined, and the recognition accuracies for individual identification marks were compared on the basis of this difference in score value. In the evaluation, by taking manufacturing variations and measurement variations between individual samples into consideration, as the score difference, the value of $(AVE_a - 4\sigma_a) - (AVE_b + 4\sigma_b)$ was used. A positive value of this score difference indicates good recognition accuracy. Further, a positive and larger value of score difference indicates better recognition accuracy. In a case where the value of score difference is negative, the closer to 0 the value of score difference is, the better the recognition accuracy.

Figure 13:
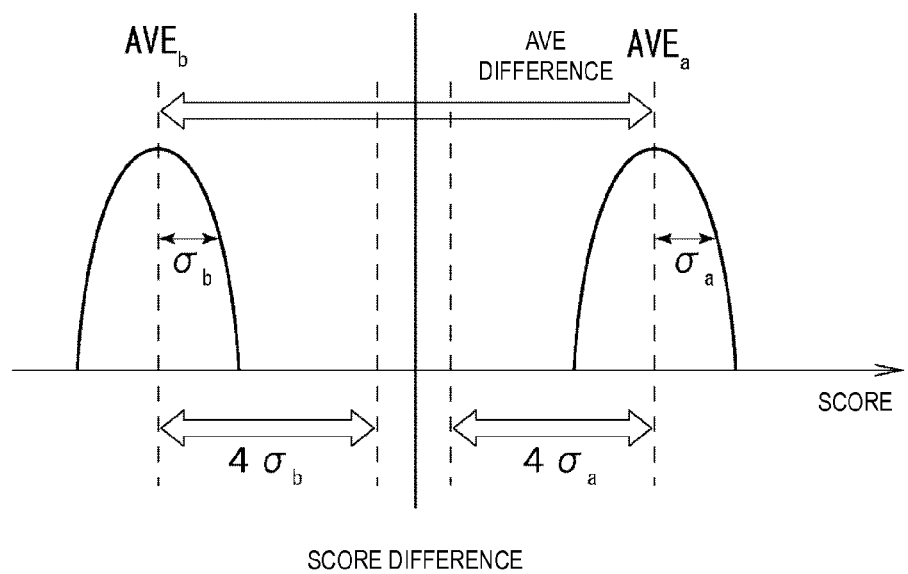
FIG. 13 is a schematic diagram for explaining a method of evaluating a shift in inter-electrode pitch in an electronic component.

In a case where a number of substrates are observed as mentioned above, while the distribution of their score values is considered to result from manufacturing and measurement variations among electrodes, the distribution exhibits variations according to the normal distribution. With respect to each of the examples and the comparative example on the upper surface of the substrate, with respect to 105 samples on the substrate, the above-mentioned score values were measured for the original position and a position shifted by one pitch from the original position, and the arithmetic mean AVE and variance $\sigma$ of the score values were determined. As illustrated in FIG. 13, if the difference between $AVE_a - 4\sigma_a$, and $AVE_b + 4\sigma_b$ with a shift of one electrode pitch in the Y-direction, that is, the above-mentioned score difference is positive, this indicates that the difference in score value due to the presence/absence of positional shift of one electrode pitch in the Y-direction is large. Therefore, this indicates a higher degree of recognition of the electronic component placement position when placing an electronic component. A positive value of this score difference indicates good recognition, and further, a positive and larger value of score difference indicates better recognition.

The score differences for Comparative Example 1 (C1) and Examples 1 to 6 (EX1 to EX6) mentioned above are illustrated in FIG. 14. As is appreciated from FIG. 14, in each of Examples 1 to 6, the value of score difference increases in comparison to Comparative Example 1, indicating higher recognition accuracy of the electronic component mounting position. That is, it is appreciated that in Examples 1 to 6, in accordance with various preferred embodiments of the present invention, the identification marks provided at the peripheral edge side of the substrate which do not interfere with the functional circuit portion of the electronic component element significantly improve the recognition accuracy for the electronic component mounting position and hence effectively reduce erroneous mounting in comparison to Comparative Example 1.

Figure 14:
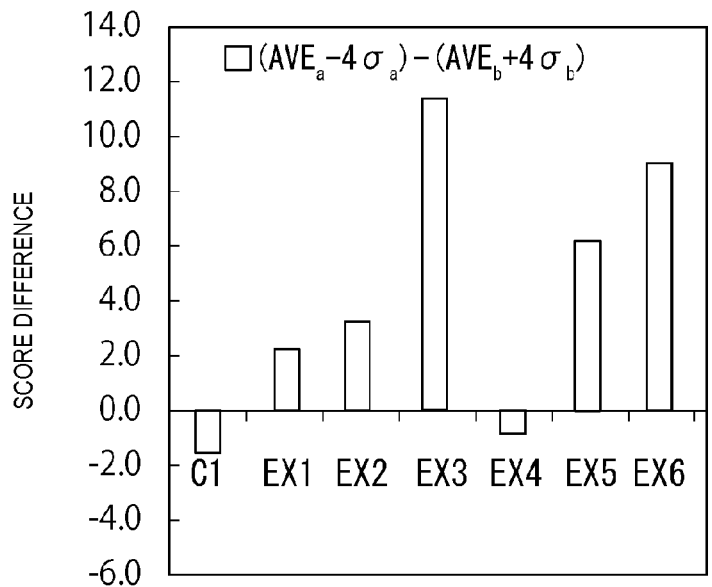
FIG. 14 illustrates the results of evaluation on a shift in inter-electrode pitch for a comparative example and examples.
Figure 15:
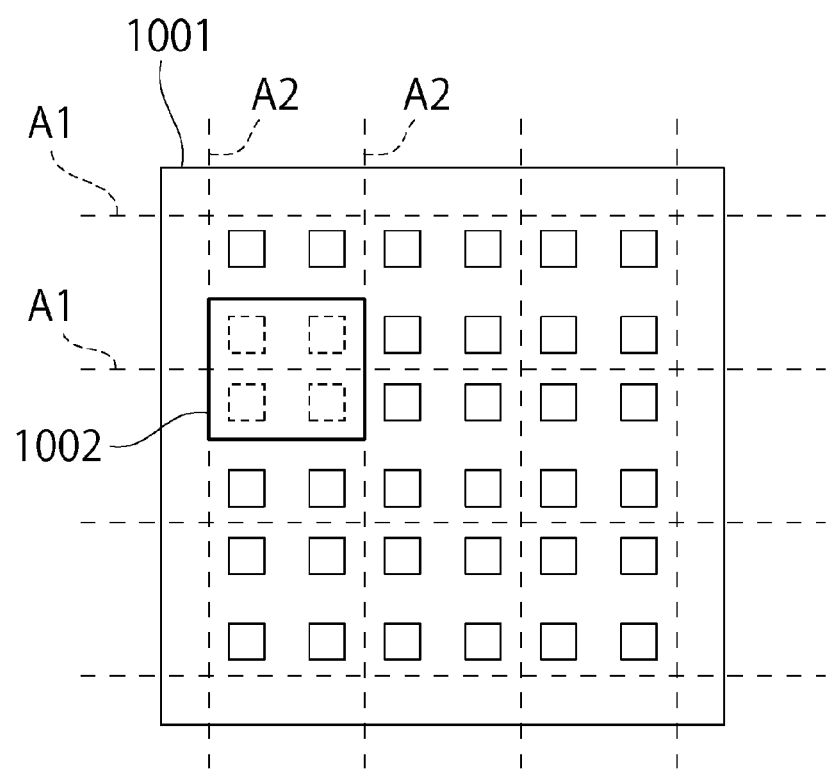
FIG. 15 is a schematic plan view for explaining an example of erroneous mounting of an electronic component element chip on a mother substrate according to related art.
Figure 16:
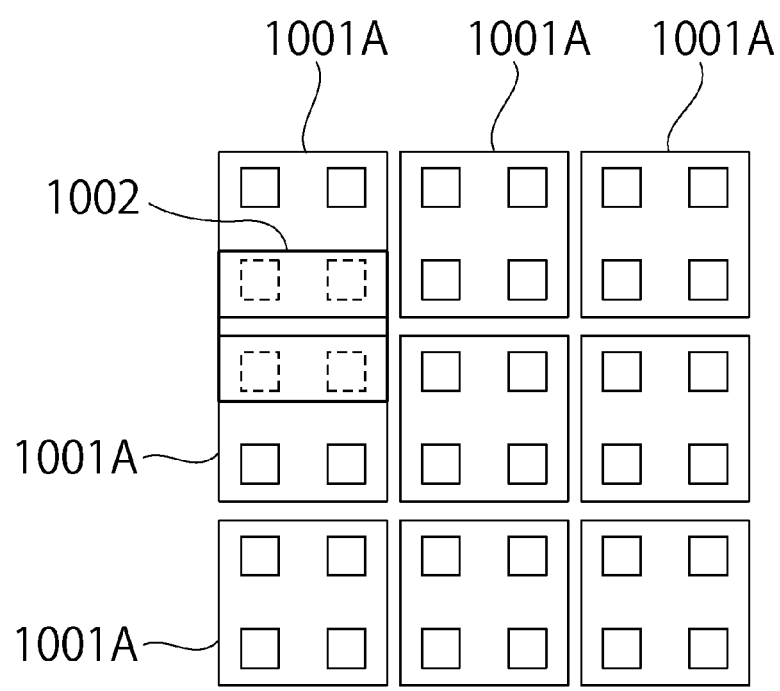
FIG. 16 is a schematic plan view illustrating an example of erroneous mounting of an electronic component element, in a case where a mother substrate is divided into individual substrates that are arranged in a grid form, in accordance with a manufacturing method according to related art.

As can be appreciated from the results of the experiment in FIG. 14, in all of Examples 1 to 6, the score difference increases, and the electrode pattern recognition accuracy is improved in comparison to Comparative Example 1.

In particular, in Example 3 and Example 6, in addition to the identification marks 37, 37A, 47, and 47A located at the peripheral edge side, each of the electrodes at the corner portions is provided with the L-shaped or substantially L-shaped identification electrode portion. Therefore, the score difference is large, and it is possible to enhance the degree of recognition of the electronic component placement position even more effectively. That said, even Example 1 and Example 4 significantly improve the recognition accuracy of the placement position in comparison to Comparative Example 1, due to the presence of the identification marks 37, 37A, 47, and 47A at the peripheral edge side of the substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a substrate including a plurality of electrodes provided in a rectangular or substantially rectangular box-shaped area on an upper surface of the substrate; and
    an electronic component element that is mounted on the upper surface of the substrate, the electronic component element including a functional circuit portion on a lower surface of the electronic component element and a plurality of bumps provided in an area surrounding the functional circuit portion; wherein
    the plurality of bumps are flip-chip bonded to the electrodes on the upper surface of the substrate so that the functional circuit portion of the electronic component element is separated by a gap from the upper surface of the substrate; and
    the electronic component further comprises an identification mark located between a first electrode and a second electrode of the plurality of electrodes provided on the upper surface of the substrate and located on or outside a line connecting outer side edges of the first and second electrodes, the first electrode being arranged along one side of the rectangular or substantially rectangular box-shaped area, the second electrode being adjacent to the first electrode along the one side.

2. The electronic component according to claim 1, wherein the identification mark is I-shape or substantially I-shaped, and extends parallel or substantially parallel to a straight line connecting the outer side edges of the first and second electrodes.

3. The electronic component according to claim 1, wherein the identification mark is provided along a peripheral edge of the substrate.

4. The electronic component according to claim 1, wherein the identification mark is arranged in an area between a straight line connecting the outer side edges of the first and second electrodes, and a boundary line extending along a peripheral edge of the substrate and separated by a predetermined distance from the peripheral edge.

5. The electronic component according to claim 1, wherein the identification mark is arranged so that in plan view, the electronic component element does not overlap the identification mark.

6. The electronic component according to claim 1, wherein in the rectangular or substantially rectangular box-shaped area including first to fourth sides, a difference between a plurality of adjacent inter-electrode pitches along the first side and a difference between a plurality of adjacent inter-electrode pitches along the second side differ from each other, and the identification mark is provided outside a side of the rectangular or substantially rectangular box-shaped area along which a difference between inter-electrode pitches is larger.

7. The electronic component according to claim 6, wherein the identification mark is arranged outside the side along which a difference between inter-electrode pitches is larger, and outside an area between electrodes that are separated by a relatively large inter-electrode pitch.

8. The electronic component according to claim 1, wherein as the electronic component element, a first electronic component element and a second electronic component element are provided on the substrate, and the rectangular or substantially rectangular box-shaped area surrounds an area in which each of the first electronic component element and the second electronic component element is provided.

9. The electronic component according to claim 1, wherein:
    the plurality of electrodes include four electrodes provided at four corner portions of the rectangular or substantially rectangular box-shaped area, at least one of the four electrodes having a rectangular or substantially rectangular shape; and
    an L-shaped or substantially L-shaped identification electrode portion is arranged so as to connect with two sides of the electrode having a rectangular or substantially rectangular shape which are located at an outer side of the substrate, the L-shaped or substantially L-shaped identification electrode portion being located on or outside a line connecting outer side edges of the plurality of electrodes provided at the corner portions.

10. An electronic component comprising:
    a substrate that includes a plurality of electrodes provided in a rectangular or substantially rectangular box-shaped area on an upper surface of the substrate; and
    an electronic component element that is mounted on the upper surface of the substrate, the electronic component element including a functional circuit portion on a lower surface of the electronic component element and a plurality of bumps provided in an area surrounding the functional circuit portion; wherein
    the plurality of bumps are flip-chip bonded to the electrodes on the upper surface of the substrate so that the functional circuit portion of the electronic component element is separated by a gap from the upper surface of the substrate;
    the plurality of electrodes include four electrodes provided at four corner portions of the rectangular or substantially rectangular box-shaped area, at least one of the four electrodes having a rectangular or substantially rectangular shape; and
    an L-shaped or substantially L-shaped identification electrode portion is arranged so as to connect with two sides of the electrode having a rectangular or substantially rectangular shape which are located at an outer side of the substrate, the L-shaped or substantially L-shaped identification electrode portion being located on or outside a line connecting outer side edges of the plurality of electrodes provided at the corner portions.

11. The electronic component according to claim 10, further comprising an identification mark located between a first electrode and a second electrode of the plurality of electrodes provided on the upper surface of the substrate and located on or outside a line connecting outer side edges of the first and second electrodes, the first electrode being arranged along one side of the rectangular or substantially rectangular box-shaped area, the second electrode being adjacent to the first electrode along the one side.

12. The electronic component according to claim 11, wherein the identification mark is I-shape or substantially I-shaped, and extends parallel or substantially parallel to a straight line connecting the outer side edges of the first and second electrodes.

13. The electronic component according to claim 11, wherein the identification mark is provided along a peripheral edge of the substrate.

14. The electronic component according to claim 11, wherein the identification mark is arranged in an area between a straight line connecting the outer side edges of the first and second electrodes, and a boundary line extending along a peripheral edge of the substrate and separated by a predetermined distance from the peripheral edge.

15. The electronic component according to claim 11, wherein the identification mark is arranged so that in plan view, the electronic component element does not overlap the identification mark.

16. The electronic component according to claim 11, wherein in the rectangular or substantially rectangular box-shaped area including first to fourth sides, a difference between a plurality of adjacent inter-electrode pitches along the first side and a difference between a plurality of adjacent inter-electrode pitches along the second side differ from each other, and the identification mark is provided outside a side of the rectangular or substantially rectangular box-shaped area along which a difference between inter-electrode pitches is larger.

17. The electronic component according to claim 16, wherein the identification mark is arranged outside the side along which a difference between inter-electrode pitches is larger, and outside an area between electrodes that are separated by a relatively large inter-electrode pitch.

18. The electronic component according to claim 10, wherein as the electronic component element, a first electronic component element and a second electronic component element are provided on the substrate, and the rectangular or substantially rectangular box-shaped area surrounds an area in which each of the first electronic component element and the second electronic component element is provided.

* * * * *